United States Patent
Almog et al.

(10) Patent No.: US 10,097,141 B1
(45) Date of Patent: Oct. 9, 2018

(54) DIGITAL PREDISTORTION TAILORED TO SPECIFIED FREQUENCIES IN THE POWER AMPLIFIER (PA) OUTPUT SPECTRUM

(71) Applicant: Intel Corporation, Santa Clara, CA (US)

(72) Inventors: Itay Almog, Ganey Tikva (IL); Michael Kerner, Tel Mond (IL); Avi Gazneli, Rehovot (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/615,192

(22) Filed: Jun. 6, 2017

(51) Int. Cl.
  *H03F 1/32* (2006.01)
  *H04L 27/36* (2006.01)
  *H04B 1/04* (2006.01)

(52) U.S. Cl.
  CPC ......... *H03F 1/3241* (2013.01); *H04B 1/0475* (2013.01); *H04L 27/367* (2013.01); *H03F 2201/3212* (2013.01); *H04B 2001/0425* (2013.01)

(58) Field of Classification Search
  CPC .................................................. H03F 1/3241
  USPC .......................................... 330/149; 375/297
  See application file for complete search history.

(56) References Cited

U.S. PATENT DOCUMENTS

| | | | |
|---|---|---|---|
| 7,418,056 B2 | 8/2008 | Suzuki et al. | |
| 8,213,884 B2 | 7/2012 | Kim et al. | |
| 8,421,534 B2 | 4/2013 | Kim et al. | |
| 8,699,620 B1 | 4/2014 | Wu | |
| 8,787,494 B2 | 7/2014 | Bai | |
| 8,843,089 B2 * | 9/2014 | Davies | H03F 1/3247 330/149 |
| 8,855,233 B2 * | 10/2014 | Cai | H04L 25/03343 330/149 |
| 9,036,734 B1 * | 5/2015 | Mauer | H04B 1/0475 375/295 |
| 9,160,280 B1 | 10/2015 | Abdelhafiz et al. | |

(Continued)

OTHER PUBLICATIONS

Kokkeler, A.B.J. "Modeling Power Amplifiers using Memory Polynomials," 12th Annualy Symposium of the IEEE/CVT, Nov. 3, 2005, Enschede, the Netherlands, pp. 1-6.

(Continued)

*Primary Examiner* — Henry Choe
(74) *Attorney, Agent, or Firm* — Eschweiler & Potashnik, LLC (57) ABSTRACT

An apparatus to apply frequency selective digital predistortion (DPD) to a power amplifier (PA) circuit is disclosed. The apparatus comprises a first transformation circuit configured to receive a PA input comprising a quantity indicative of an input signal of the PA circuit and process the PA input by applying a first predetermined weighted function, to form a processed PA input, and a second transformation circuit configured to receive a PA output comprising a quantity indicative of an output signal of the PA circuit and process the PA output by applying a second predetermined weighted function, to form a processed PA output. The apparatus further comprises a coefficient computation circuit configured to receive the processed PA input and the processed PA output; and estimate distortion coefficients, to be utilized for predistorting the input signal of the PA circuit, based on the processed PA input and the processed PA output.

28 Claims, 4 Drawing Sheets

(56) References Cited

U.S. PATENT DOCUMENTS

| | | | |
|---|---|---|---|
| 9,214,969 B2 | 12/2015 | Hammi | |
| 9,258,156 B2 | 2/2016 | Wloczysiak | |
| 2005/0116775 A1 | 6/2005 | McBeath et al. | |
| 2013/0257530 A1* | 10/2013 | Davies | H03F 1/3247 |
| | | | 330/149 |
| 2015/0097618 A1* | 4/2015 | Lozhkin | H03G 3/3042 |
| | | | 330/149 |

OTHER PUBLICATIONS

Jebali, Chokri, et al. "Modeling PA Behavior and Memory Effects, Part 1," Modeling PA Behavior and Memory Effects, Part 1. Test & Measurement content from Microwaves & RF, 8 pages.

Morgan, Dennis R. et al. "A Generalized Memory Polynomial Model for Digital Predistortion of RF Power Amplifiers," IEEE Transactions on Signal Processing, vol. 54, No. 10, Oct. 2006. pp. 3852-3860.

Schutz, Kerry. "Adaptive DPD Design: A Top-Down Workflow." Adaptive DPD Design: A Top-Down Workflow—MATLAB & Simulink, Jan. 31, 2017, 7 pages.

Xu, Jinbiao. "Practical Digital Pre-Distortion Techniques for PA Linearization in 3GPP LTE." Agilent Technologies. May 26, 2010. 24 pages.

* cited by examiner

DIGITAL PREDISTORTION TAILORED TO SPECIFIED FREQUENCIES IN THE POWER AMPLIFIER (PA) OUTPUT SPECTRUM

FIELD

The present disclosure relates to power amplifiers (PAs), and more specifically to an apparatus and a method for applying frequency selective digital predistortion (DPD) in power amplifiers.

BACKGROUND

Wireless communication systems typically use power amplifiers to amplify signals prior to over the air transmission. The efficiency of a power amplifier generally impacts the performance of devices such as mobile phones and base stations. High efficiency power amplifiers are typically non-linear in power output response, and exhibits nonlinear and memory effects. Non-linear amplification may cause out-of-band (OOB) emissions or spectral regrowth and in-band distortions (e.g., error vector magnitude (EVM) degradation). Thus, linearization technologies have been developed in various forms to compensate for non-linear distortion characteristics of an amplifier to ensure stable and high quality signal transmissions. One way to improve a power amplifier's efficiency and its overall linearity is by digital predistortion, where the input to the power amplifier is digitally predistorted, in order to compensate for the distortion introduced by the power amplifier.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

In one embodiment of the disclosure, an apparatus that facilitates to apply frequency selective digital predistortion (DPD) to a power amplifier (PA) circuit is disclosed. The apparatus comprises a first transformation circuit configured to receive a PA input comprising a quantity indicative of an input signal of the PA circuit and process the PA input by applying a first predetermined weighted function, to form a processed PA input, and a second transformation circuit configured to receive a PA output comprising a quantity indicative of an output signal of the PA circuit and process the PA output by applying a second predetermined weighted function, to form a processed PA output. In some embodiments, the first predetermined weighted function and the second predetermined weighted function facilitates to apply specific weights to specified frequencies in an output spectrum of the PA circuit. In some embodiments, the apparatus further comprises a coefficient computation circuit configured to receive the processed PA input and the processed PA output; and estimate distortion coefficients, to be utilized for predistorting the input signal of the PA circuit, based on the processed PA input and the processed PA output.

In one embodiment of the disclosure, a power amplifier (PA) system is disclosed. The PA system comprises a PA circuit configured to receive a PA input signal and amplify the PA input signal to generate a PA output signal based thereon. The PA system further comprises a coefficient estimation circuit, comprising a first transformation circuit configured to receive a PA input comprising a quantity indicative of the PA input signal associated with the PA circuit and process the PA input by applying a first predetermined weighted function, to form a processed PA input, and a second transformation circuit configured to receive a PA output comprising a quantity indicative of the PA output signal associated with the PA circuit and process the PA output by applying a second predetermined weighted function, to form a processed PA output. In some embodiments, the first predetermined weighted function and the first predetermined weighted function facilitates to apply specific weights to specified frequencies in an output spectrum of the PA circuit. In some embodiments, the coefficient estimation circuit further comprises a coefficient computation circuit configured to receive the processed PA input and the processed PA output; and estimate distortion coefficients to be utilized for predistorting the PA input signal, based on the processed PA input and the processed PA output.

In one embodiment of the disclosure, a method for applying frequency selective digital predistortion (DPD) to a power amplifier (PA) circuit is disclosed. The method comprises receiving a PA input comprising a quantity indicative of an input signal of the PA circuit and processing the PA input by applying a first predetermined weighted function, to form a processed PA input, at a first transformation circuit and receiving a PA output comprising a quantity indicative of an output signal of the PA circuit and processing the PA output by applying a second predetermined weighted function, to form a processed PA output, at a second transformation circuit. In some embodiments, the first predetermined weighted function and the first predetermined weighted function facilitates to apply specific weights to specified frequencies in an output spectrum of the PA circuit. The method further comprises receiving the processed PA input and the processed PA output, and estimating distortion coefficients to be utilized for predistorting the input signal of the PA circuit, based on the processed PA input and the processed PA output, at a coefficient computation circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, the efficiency and linearity of a power amplifier can be improved by utilizing digital predistortion (DPD). In multiple high volume wireless technologies, the transmitted power of a power amplifier is limited due to standard and regulatory constraints on out of band (OOB) emissions. Consequently, in competitive transmitting devices within such technologies, technologies like DPD are utilized currently, in order to reduce the OOB emissions and increase the transmitted power. In order to fully exploit the potential of DPD, in some embodiments, memory effects of power amplifiers are taken into account. Some of the causes of the memory effects include transport delay and rapid thermal time constants of the active devices themselves, as well as components in the biasing circuits that give rise to effects that are dependent on the signal envelope.

In some embodiments, the digital predistortion of a power amplifier (PA) is realized by determining DPD coefficients by taking memory effects into account and modifying (i.e., predistorting) an input signal to the power amplifier based on the determined DPD coefficients. In some embodiments, predistorting the input signal comprises providing an inverse distortion to the input signal, based on an inverse model of the power amplifier. In some embodiments, the DPD coefficients are estimated by determining inverse PA coefficients based on an inverse model of the PA. Alternately, in other embodiments, the DPD coefficients are estimated by determining the PA coefficients and deriving inverse PA coefficients from the PA coefficients. Current methods for determining DPD coefficients applies same weights to in-band emissions and OOB emissions, which in turn affects the amount of transmitted power. For example, when the OOB emissions are reduced, the in-band frequencies are also attenuated, which reduce the overall transmitted power. Therefore, in order to overcome the above disadvantage, an apparatus and a method for determining DPD coefficients is proposed in this disclosure. In some embodiments, the method proposed herein applies different weights to in-band and OOB errors. In other words, the method proposed herein enables to apply different weights for different frequencies in the PA output spectrum and thereby emphasize specified frequencies in the PA output spectrum. In some embodiments, applying different weights to different frequencies in the PA output spectrum enables to increase the transmitted power of the PA and also increase the power amplifier's throughput, according to encountered channel conditions in the PA output spectrum.

Figure 1:
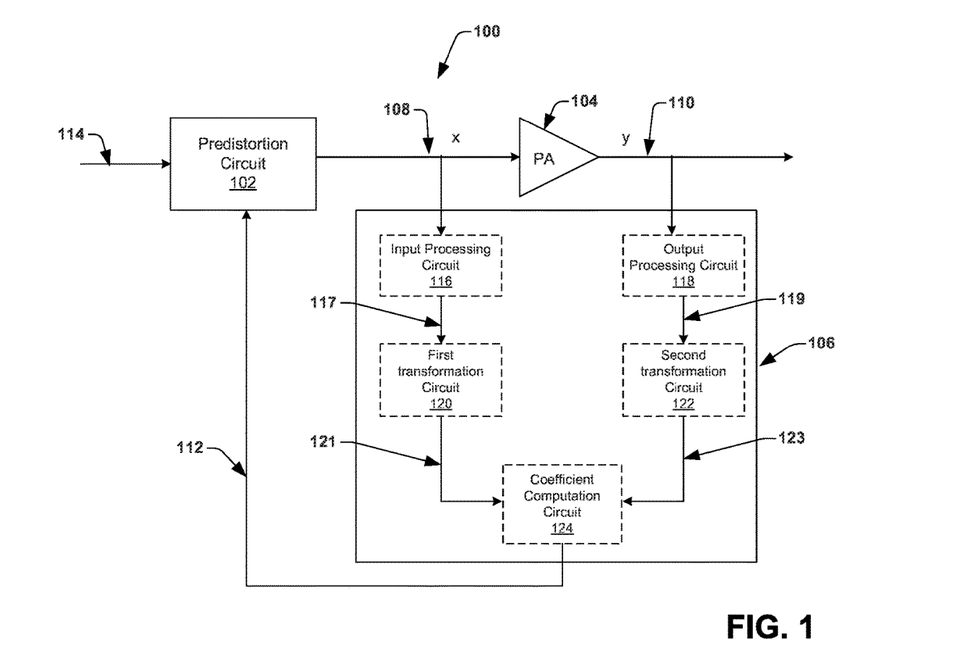
FIG. 1 illustrates a simplified block diagram of an exemplary power amplifier (PA) system, according to one embodiment of the disclosure.

FIG. 1 illustrates a simplified block diagram of an exemplary power amplifier (PA) system 100, according to one embodiment of the disclosure. In some embodiments, the PA system 100 facilitates to provide a frequency selective digital predistortion to PAs. In some embodiments, the PA system 100 described herein can be part of wireless communication devices like mobile phones, base stations etc. The PA system 100 comprises a PA circuit 104, a coefficient estimation circuit 106 and a predistortion circuit 102. In some embodiments, the PA circuit 104 is configured to receive a PA input signal 108 and generate a PA output signal 110 based thereon. In some embodiments, the PA circuit 104 is configured to amplify the PA input signal 108 and therefore, in such embodiments, the PA output signal 110 is an amplified version of the PA input signal 108. The coefficient estimation circuit 106 is coupled to the PA circuit 104 and is configured to receive the PA input signal 108 and the PA output signal 110. In some embodiments, the coefficient estimation circuit 106 is further configured to generate distortion coefficients 112 associated with the PA circuit 104, based on the received PA input signal 108 and the PA output signal 110. In some embodiments, the distortion coefficients 112 corresponds to inverse PA coefficients based on an inverse memory model of the PA circuit 104, and in other embodiments, the distortion coefficients 112 corresponds to PA coefficients based on a memory model of the PA circuit 104.

The predistortion circuit 102 is coupled to the coefficient estimation circuit 106 and is configured to receive the distortion coefficients 112 from the coefficient estimation circuit 106. In some embodiments, the predistortion circuit 102 is configured to modify (e.g., predistort) an input signal 114 based on the plurality of distortion coefficients 112, in order to generate the PA input signal 108. In a first instance associated with the PA circuit 104, the PA input signal 108 and the input signal 114 are the same. However, from the next instance (e.g., a second instance following the first instance), the PA input signal 108 and the input signal 114 are different, depending on the predistortion applied by the predistortion circuit 102. The key idea behind digital predistortion in power amplifiers to is predistort an input signal (e.g., the input signal 114) to a power amplifier (PA), based on an inverse model of the PA. Therefore, in some embodiments, the predistortion circuit 102 applies inverse distortion to the input signal 114, so that a cascaded system comprising the predistortion circuit 102 and the PA circuit 104 behaves linearly. In some embodiments, the predistortion circuit 102 applies the inverse distortion to the input signal 114 based on the distortion coefficients 112 received from the coefficient estimation circuit 106. In some embodiments, when the distortion coefficients 112 comprise the inverse PA coefficients, the predistortion circuit 102 directly utilizes the distortion coefficients 112, in order to apply inverse distortion to the input signal 114. However, in other embodiments, when the distortion coefficients 112 comprise PA coefficients, the predistortion circuit 102 further process the distortion coefficients 112 to generate the inverse PA coefficients, in order to apply inverse distortion to the input signal 114.

In some embodiments, the processing of the PA input signal 108 and the PA output signal 110 within the coefficient estimation circuit 106 are performed in digital domain. Therefore, in some embodiments, the coefficient estimation circuit 106 can comprise a PA input processing circuit 116 configured to process the PA input signal 108 and generate a PA input 117 comprising a plurality of PA input samples. Similarly, the coefficient estimation circuit 106 can comprise a PA output processing circuit 118 configured to process the PA output signal 110 and generate a PA output 119 comprising a plurality of PA output samples. Alternately, in other embodiments, the coefficient estimation circuit 106 can be implemented differently.

In some embodiments, the PA circuit 104 is modelled using predetermined memory models, in order to account for the memory effects associated with the PA circuit 104, the details of which are given in an embodiment below. In some embodiments, when the distortion coefficients 112 comprise the inverse PA coefficients, in order to determine the inverse PA coefficients, an inverse memory model of the PA circuit 104 is used, where an output of the PA circuit 104 is utilized to predict its input. Therefore, in such embodiments, the PA output 119 comprises a PA output matrix, the entries of the matrix computed in accordance with the inverse memory model of the PA circuit 104, based on the PA output samples and the PA input 117 comprises a plurality of PA input samples. Alternately, in some embodiments, when the distortion coefficients 112 comprise the PA coefficients, the predetermined memory model is utilized to determine the distortion coefficients 112. Therefore, in such embodiments, the PA input 117 comprises a PA input matrix, the entries of the matrix computed in accordance with the predetermined memory model of the PA circuit 104, based on the PA input samples and the PA output 119 comprises a plurality of PA output samples. In some embodiments, the distortion coefficients 112 are determined at the coefficient estimation circuit 106 by utilizing the PA input 117 and the PA output 119.

In some embodiments, in order to apply different weights to different frequencies associated with the PA output spectrum or to emphasize specified frequencies in the PA output spectrum, the PA input 117 associated with the PA input signal 108 and the PA output 119 associated with the PA output signal 110 are pre-processed to generate a processed PA input 121 and processed PA output 123, respectively, prior to generating the distortion coefficients 112. In such embodiments, the distortion coefficients 112 are determined at the coefficient estimation circuit 106, based on the processed PA input 121 and the processed PA output 123. In some embodiments, the processed PA input 121 and the processed PA output 123 are generated based on applying a linear transformation to the PA input 117 and the PA output 119, respectively. In some embodiments, the linear transformation to be applied to the PA input 117 and the PA output 119 are determined based on a required frequency response associated with the PA output spectrum. In some embodiments, the linear transformation is applied by processing (e.g., multiplying) the PA input 117 and the PA output 119 by a linear transformation matrix, comprising a plurality of filter coefficients associated with a predetermined filter that has a required frequency response.

In some embodiments, applying the linear transformation corresponds to filtering the PA input 117 and the PA output 119 using the predetermined filter (or the filter coefficients associated therewith). In particular, while determining the inverse PA coefficients, applying the linear transformation corresponds to filtering the PA input 117 and the columns of the PA output matrix associated with the PA output 119 using the predetermined filter (or the filter coefficients associated therewith). Similarly, while determining the PA coefficients, applying the linear transformation corresponds to filtering the columns of the PA input matrix associated with the PA input 117 and the PA output 119 using the predetermined filter (or the filter coefficients associated therewith). Further, in some embodiments, the linear transformation is applied by processing the PA input 117 and the PA output 119 by a linear transformation matrix, comprising a plurality of filter coefficients that defines a filter that has same or similar response as the predetermined filter. In some embodiments, applying the linear transformation to the PA input 117 and the PA output 119, prior to determining the distortion coefficients 112, enables to apply different weights to different frequencies in the PA output spectrum.

In some embodiments, the coefficient estimation circuit 106 can comprise a first transformation circuit 120 configured to apply a first predetermined weighted function indicative of the linear transformation, to the PA input 117, in order to generate the processed PA input 121. Further, in some embodiments, the coefficient estimation circuit 106 can comprise a second transformation circuit 122 configured to apply a second predetermined weighted function indicative of the linear transformation, to the PA output 119. In some embodiments, the first predetermined weighted function and the second predetermined weighted function comprise a linear transformation matrix, comprising a plurality of filter coefficients associated with the predetermined filter. In some embodiments, applying the first predetermined weighted function to the PA input 117 is equivalent to filtering the PA input 117 using the predetermined filter (or the filter coefficients associated therewith). Similarly, in some embodiments, applying the second predetermined weighted function to the PA output 119 is equivalent to filtering the PA output 119 using the predetermined filter (or the filter coefficients associated therewith).

In some embodiments, the first predetermined weighted function and the second predetermined weighted function are the same. That is, in such embodiments, the linear transformation matrix comprising the first predetermined weighted function and the second predetermined weighted function are the same, for example, same linear transformation matrix, F indicative of the predetermined filter. However, in other embodiments, the linear transformation matrix comprising the first predetermined weighted function and the second predetermined weighted function could be different. For example, in one embodiment, the first predetermined weighted function can comprise a first linear transformation matrix F1 and the second predetermined weighted function can comprise a second, different linear transformation matrix F2, where both the linear transformation matrices F1 and F2 are indicative of a respective filter that has similar characteristics as the predetermined filter. Further, in other embodiments, other linear transformation matrices, for example, F1 and F2, that provide similar frequency response for the processed PA input 121 and the processed PA output 123, respectively, are also contemplated to be within the scope of this disclosure.

In some embodiments, the coefficient estimation circuit 106 can further comprise a coefficient computation circuit 124 configured to receive the processed PA input 121 and the processed PA output 123, and generate the plurality of distortion coefficients 112, based on the processed PA input 121 and the processed PA output 123, in accordance with a predetermined relation, the details of which are given in an embodiment below. In some embodiments, the predetermined relation comprises a first predetermined relation for determining the distortion coefficients 112 comprising the inverse PA coefficients. Alternately, in other embodiments, the predetermined relation comprises a second predetermined relation for determining the distortion coefficients 112 comprising the PA coefficients. Upon determining the distortion coefficients 112, in some embodiments, the coefficient estimation circuit 106 is further configured to provide the distortion coefficients 112 to the predistortion circuit 102.

Figure 2:
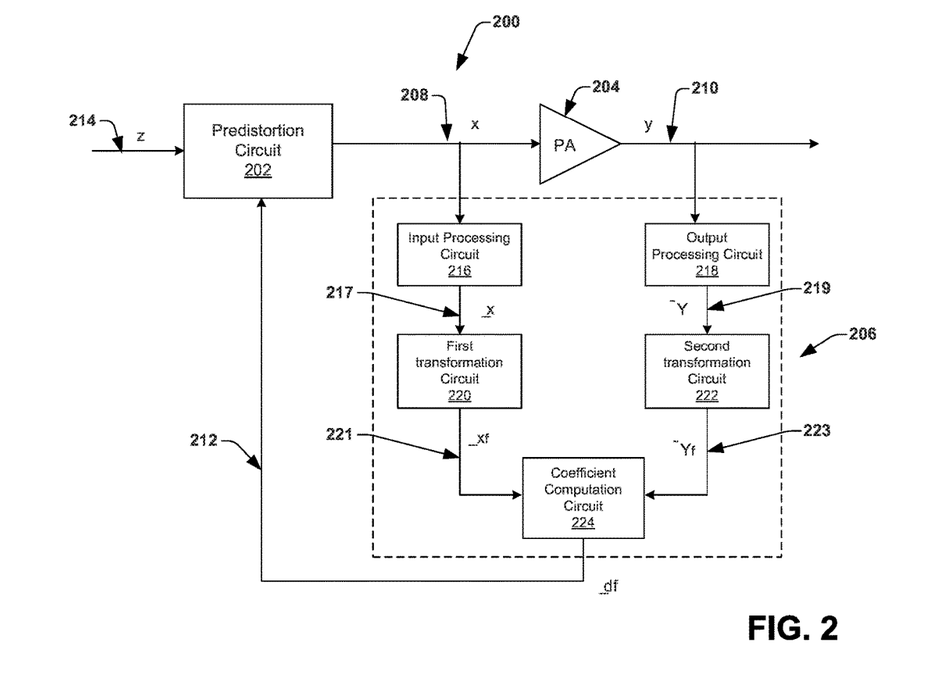
FIG. 2 illustrates an example implementation of an exemplary power amplifier (PA) system that facilitates a frequency selective digital predistortion, according to one embodiment of the disclosure.

FIG. 2 illustrates an example implementation of an exemplary power amplifier (PA) system 200 that facilitates a frequency selective digital predistortion, according to one embodiment of the disclosure. The PA system 200 depicts one possible way of implementation of the PA system 100 in FIG. 1. In particular, the PA system 200 depicts one possible way of estimating frequency selective inverse PA coefficients associated with a PA circuit of the PA system 200, in order to facilitate the frequency selective digital predistortion. Other possible ways of implementation of the PA system 100 are also be contemplated to be within the scope of this disclosure. The PA system 200 comprises a PA circuit 204, a coefficient estimation circuit 206 and a predistortion circuit 202. In some embodiments, the PA circuit 204 is configured to receive a PA input signal 208 and generate a PA output signal 210 based thereon. In some embodiments, the PA circuit 204 is configured to amplify the PA input signal 208 and therefore, in some embodiments, the PA output signal 210 is an amplified version of the PA input signal 208.

The coefficient estimation circuit 206 is coupled to the PA circuit 204 and is configured to receive the PA input signal 208 and the PA output signal 210. In some embodiments, the coefficient estimation circuit 206 is further configured to generate distortion coefficients 212 based on the received PA input signal 208 and the PA output signal 210. In this embodiment, the distortion coefficients 212 comprises the inverse PA coefficients associated with the PA circuit 204. Upon determining the distortion coefficients 212, the coefficient estimation circuit 206 is configured to provide the distortion coefficients 212 to the predistortion circuit 202, in order to predistort the input signal 214. The key idea behind digital predistortion in power amplifiers that is utilized herein, is to predistort an input signal (e.g., an input signal 214) to a power amplifier (PA), based on an inverse distortion provided to the input signal 214. In some embodiments, the predistortion circuit 202 can be seen as an inverse of the PA circuit 204. In some embodiments, in order to determine the inverse PA coefficients (i.e., the distortion coefficients 212), an inverse model associated with the PA circuit 204 is utilized. In some embodiments, the inverse model of the PA circuit 204 is derived based on an information of a memory model (to account for the memory effects) utilized for modelling the PA circuit 204.

As an example, if we consider a memory polynomial model for the PA circuit 204, an output sample y(n) associated with the PA output signal 210 is defined as:

$$y(n) = \sum_{k=1}^{K} \sum_{q=0}^{Q-1} a_{kq} x(n-q) |x(n-q)|^{k-1} \quad (1)$$

Where k is the polynomial order, q is the memory order, $a_{kq}$ comprise PA model coefficients and x comprise the PA input samples. In this example embodiment, a memory polynomial model of the PA circuit 204 is utilized as the memory model for modelling the PA circuit 204. However, in other embodiments, other memory models can be utilized for modelling the PA circuit 204.

For K=2 and Q=2, $$y(n) = a_{10} \cdot x(n) + a_{11} \cdot x(n-1) + a_{20} \cdot x(n) |x(n)|^1 + a_{21} \cdot x(n-1) |x(n-1)|^1 \quad (2)$$

For a plurality of input samples, $$\begin{bmatrix} y(n) \\ y(n-1) \\ y(n-2) \\ \vdots \end{bmatrix} = \begin{bmatrix} x(n) & x(n-1) & x(n)|x(n)| & x(n-1)|x(n-1)| \\ x(n-1) & x(n-2) & x(n-1)|x(n-1)| & x(n-2)|x(n-2)| \\ x(n-2) & x(n-2) & x(n-2)|x(n-2)| & x(n-3)|x(n-3)| \\ \vdots & \vdots & \vdots & \vdots \end{bmatrix} \begin{bmatrix} a_{10} \\ a_{11} \\ a_{20} \\ a_{21} \end{bmatrix} \quad (3)$$

Which can be written in a simplified form as:

$$\underline{y} = \tilde{X} \cdot \underline{w} \quad (4)$$

Where $\underline{y}$ comprises an (N×1) output vector comprising measured samples of the PA output signal 210, $\tilde{X}$ is a (N×P) PA input matrix constructed based on PA input measurements based on the memory model chosen and $\underline{w}$ is a (P×1) PA coefficient vector. In some embodiments, the equation (4) above depicts a memory model associated with a PA (e.g., the PA circuit 204). If we consider the memory model as given in equation (3) above, the PA coefficient vector $\underline{w}$ comprises the coefficients $a_{kq}$ and the number of coefficients P in the PA coefficient vector $\underline{w}$ depends on the polynomial order K and the memory order Q chosen. In some embodiments, the PA coefficient vector $\underline{w}$ can be determined based on solving equation (4) above. Therefore, in some embodiments, the PA input matrix $\tilde{X}$ and the output vector $\underline{y}$ has to be determined, in order to determine the PA coefficient vector $\underline{w}$.

In some embodiments, an inverse model of the PA circuit 204 can be derived based on replacing y(n) by x(n) and x(n−q) by y(n−q) in equation (3), as given below:

$$\begin{bmatrix} x(n) \\ x(n-1) \\ x(n-2) \\ \vdots \end{bmatrix} = \begin{bmatrix} y(n) & y(n-1) & y(n)|y(n)| & y(n-1)|y(n-1)| \\ y(n-1) & y(n-2) & y(n-1)|y(n-1)| & y(n-2)|y(n-2)| \\ y(n-2) & y(n-2) & y(n-2)|y(n-2)| & y(n-3)|y(n-3)| \\ \vdots & \vdots & \vdots & \vdots \end{bmatrix} \begin{bmatrix} b_{10} \\ b_{11} \\ b_{20} \\ b_{21} \end{bmatrix} \quad (5)$$

Therefore, in general, for any memory model utilized and a plurality of samples considered, the inverse model of a PA circuit (e.g., the PA circuit 204) having an input x (e.g., the PA input signal 208) and output y (e.g., the PA output signal 210), can be written in a simplified form as given below:

$$\underline{x} = \tilde{Y} \cdot \underline{d} \quad (6)$$

Where $\underline{d}$ is a (P×1) inverse coefficient vector comprising the coefficients of the inverse model of the PA circuit 204, $\underline{x}$ is an (N×1) input vector comprising a plurality of input samples associated with the PA input signal 208 and $\tilde{Y}$ is an (N×P) PA output matrix constructed based on PA output measurements, in accordance with the inverse model chosen. If we consider the inverse model as given in equation (5) above, the inverse coefficient vector $\underline{d}$ comprises the coefficients $b_{kq}$ and the number of coefficients P in the inverse coefficient vector $\underline{d}$ depends on the polynomial order K and the memory order Q chosen. In some embodiments, the inverse coefficient vector $\underline{d}$ can be determined based on solving equation (6) above. Therefore, in some embodiments, the input vector $\underline{x}$ and the PA output matrix $\tilde{Y}$ has to be determined, in order to determine the inverse coefficient vector $\underline{d}$.

In some embodiments, the coefficient estimation circuit 206 comprises a PA input processing circuit 216 configured to process the PA input signal 208 and generate a PA input $\underline{x}$ 217, based on the PA input signal 208. In some embodiments, the PA input $\underline{x}$ 217 comprises a plurality of PA input samples. In some embodiments, the PA input 217 corresponds to the input vector $\underline{x}$ in equation (6) above. In some embodiments, the PA input processing circuit 216 can comprise, but not limited to, an analog-to-digital converter (ADC) configured to convert the PA input signal 208 from analog to digital domain. Further, the PA input processing circuit 216 can comprise a mixer and an alignment circuit configured to align digital samples associated with the PA input signal 208, to output samples associated with the PA output signal 210. In other embodiments, the PA input processing circuit 216 can have additional circuits configured to process the PA input signal 208 and generate the PA input $\underline{x}$ 217 based thereon. In some embodiments, a number of PA input samples to be included in the PA input $\underline{x}$ 217 is predetermined based on the PA system requirements.

In some embodiments, the coefficient estimation circuit 206 further comprises a PA output processing circuit 218 configured to process the PA output signal 210 and generate a PA output $\tilde{Y}$ 219, based on the PA output signal 210. In some embodiments, the PA output 219 comprises a PA output matrix $\tilde{Y}$ comprising a plurality of entries. In some embodiments, the entries of the PA output matrix $\tilde{Y}$ is determined based on determining a plurality of PA output samples (i.e., PA output measurements), and applying the PA output measurements to an inverse model associated with the PA circuit 204. In some embodiments, the PA output 219 corresponds to the PA output matrix $\tilde{Y}$ in equation (6) above. In such embodiments, the entries of the PA output matrix $\tilde{Y}$ comprises the entries given in equation (5) above. However, in other embodiments, the PA output matrix $\tilde{Y}$ can comprise other entries different from that given in equation (5) above, depending on the inverse memory model chosen for modelling the PA circuit 204.

In some embodiments, an information of the memory model chosen and consequently, the PA output matrix $\tilde{Y}$, is predetermined and is assumed to be available to the output processing circuit 218 (e.g., stored in a memory associated with the output processing circuit 218). In some embodiments, the PA output processing circuit 218 is configured to generate a plurality of PA output samples from the PA output signal 210, in order to generate the PA output matrix $\tilde{Y}$, prior to generating the PA output 219. In some embodiments, the PA output processing circuit 218 can comprise, but not limited to, an analog-to-digital converter (ADC) configured to convert the PA output signal 210 from analog to digital domain. Further, the PA output processing circuit 218 can comprise a mixer (e.g., a down-conversion mixer) and an alignment circuit configured to align digital samples associated with the PA output signal 210, to the input samples associated with the PA input signal 208. In other embodiments, the PA output processing circuit 218 can have additional circuits configured to process the PA output signal 210 and generate the PA output $\tilde{Y}$ 219 based thereon.

In some embodiments, in order to apply different weights to different frequencies associated with the PA output spectrum, the PA input $\underline{x}$ 217 associated with the PA input signal 208 and the PA output $\tilde{Y}$ 219 associated with the PA output signal 210 are pre-processed to generate a processed PA input $\underline{x}_f$ 221 and processed PA output $\tilde{Y}_f$ 223, respectively, prior to generating the distortion coefficients 212, as explained above in FIG. 1. In some embodiments, the coefficient estimation circuit 206 further comprises a first transformation circuit 220 configured to apply a first predetermined weighted function, to the PA input 217, in order to generate a processed PA input $\underline{x}_f$ 221. Further, the coefficient estimation circuit 106 comprise a second transformation circuit 222 configured to apply a second predetermined weighted function, to the PA output 219, in order to generate the processed PA output $\tilde{Y}_f$ 223. In some embodiments, the first predetermined weighted function and the second predetermined weighted function are indicative of a linear transformation that enables to apply different weights to different frequencies in the PA output spectrum. In some embodiments, the linear transformation to be applied to the PA input 217 and the PA output 219 are determined based on a required frequency response associated with the PA output spectrum.

In some embodiments, the first predetermined weighted function and the second predetermined weighted function are the same. In some embodiments, the first predetermined weighted function and the second predetermined weighted function comprise a linear transformation matrix F, comprising a plurality of filter coefficients associated with a predetermined filter that has the required frequency response. However, in other embodiments, the first weighted function can comprise a linear transformation matrix F1 and the second weighted function can comprise a linear transformation matrix F2, as explained above with respect to FIG. 1. In some embodiments, applying the first predetermined weighted function to the PA input 217 is equivalent to filtering the PA input 217 using the predetermined filter (or the filter coefficients associated therewith). Similarly, in some embodiments, applying the second predetermined weighted function to the PA output 219 is equivalent to filtering the columns of the PA output matrix Ŷ associated with the PA output 219 using the predetermined filter (or the filter coefficients associated therewith). In some embodiments, applying the linear transformation, for example, the linear transformation matrix F, to the PA input 217 and the PA output 219, prior to determining the distortion coefficients 212, enables to apply different weights to different frequencies in the PA output spectrum.

In this embodiment, the first weighted function and the second weighted function are assumed to be same, comprising a linear transformation matrix F. However, in other embodiments, the first weighted function and the second weighted function can be different. Therefore, in such embodiments, the processed PA input 221 is as given below:

$$\underline{x}_f = F \cdot \underline{x} \qquad (7)$$

Where $\underline{x}_f$ is the processed PA input 221, F is the linear transformation matrix and $\underline{x}$ is the PA input 217.
Similarly, the processed PA output 223 is given as below:

$$\tilde{Y}_f = F \cdot \tilde{Y} \qquad (8)$$

Where $\tilde{Y}_f$ is the processed PA output 223, F is the linear transformation matrix and Ŷ is the PA output matrix associated with the PA output 219.
In some embodiments, the linear transformation matrix F comprises a plurality of filter coefficients and can be given as below:

$$F = \begin{bmatrix} h1 & \cdots & hk & 0 & 0 & \cdots \\ 0 & h1 & \cdots & hk & 0 & \cdots \\ 0 & 0 & h1 & \cdots & hk & 0 \\ 0 & 0 & 0 & h1 & h2 & \cdots \\ 0 & 0 & 0 & 0 & h1 & \cdots \\ \vdots & \vdots & \vdots & \vdots & \vdots & \ddots \end{bmatrix} \qquad (9)$$

Where h1, h2 . . . hk are the filter coefficients of the predetermined filter (e.g., a lowpass filter, high pass filter etc.).

Based on the processed PA input 221 $\underline{x}_f$ and the processed PA output 223 $\tilde{Y}_f$, the inverse model of the PA circuit 204 is given as below:

$$\underline{x}_f = \tilde{Y}_f \cdot \underline{d}_f \qquad (10)$$

Where $\underline{d}_f$ correspond to the distortion coefficients 212 to be determined at the coefficient estimation circuit 206, $\underline{x}_f$ is the processed PA input 221 and $\tilde{Y}_f$ is the processed PA output 223. In some embodiments, $\underline{d}_f$ in equation (10) is an improved estimate of the inverse coefficient vector $\underline{d}$ in equation (6), based on applying the linear transformation. In some embodiments, the distortion coefficients $\underline{d}_f$ 212 can be determined based on solving equation (10) above. In some embodiments, the equation (10) above is solved based on defining an estimation error e given below as:

$$e = \underline{x}_f - \tilde{Y}_f \underline{d}_f \qquad (11)$$

And a least squares solution for the coefficients $\underline{d}$ that minimizes $\|e^2\|$ is given by:

$$\underline{d}_f = (Y_f^H \cdot Y_f)^{-1} \cdot Y_f^H \cdot \underline{x}_f \qquad (12)$$

In some embodiments, the coefficient estimation circuit 206 further comprises a coefficient computation circuit 224 coupled to the first transformation circuit 220 and the second transformation circuit 222, and configured to receive the processed PA input 221 $\underline{x}_f$ from the first transformation circuit 220 and the processed PA output $\tilde{Y}_f$ 223 from the second transformation circuit 222. In some embodiments, the coefficient computation circuit 224 is further configured to determine the distortion coefficients $\underline{d}_f$ 212, based on the received processed PA input 221 $\underline{x}_f$ and the processed PA output $\tilde{Y}_f$. In some embodiments, the distortion coefficients $\underline{d}_f$ 212 are determined at the coefficient computation circuit 224 based on implementing the predetermined relation in the equation (12) above. However, other equations for determining the distortion coefficients $\underline{d}_f$ 212 are also contemplated to be within the scope of this disclosure.

Upon determining the distortion coefficients $\underline{d}_f$ 212, the coefficient computation circuit 224 is further configured to provide the distortion coefficients $\underline{d}_f$ 212 to the predistortion circuit 202. In this embodiment, since the distortion coefficients $\underline{d}_f$ 212 comprises the inverse PA coefficients, the distortion coefficients $\underline{d}_f$ 212 are directly utilized at the predistortion circuit 202, in order to modify the input signal z 214. In some embodiments, the predistortion circuit 202 is configured to modify the input signal z 214 in order to generate the predistorted input signal x 208 (i.e., the PA input signal x 208) based on the following equation:

$$x = Z \cdot \underline{d}_f \qquad (12a)$$

where Z is an input signal matrix associated with the input signal z 214. In some embodiments, the coefficients $\underline{d}_f$ in equation (12a) are referred to as DPD coefficients. In some embodiments, the input signal matrix Z is generated at the predistortion circuit 202 from the input signal z 214, based on a predetermined memory model (e.g., as given in equation (3) above). In some embodiments, the predetermined memory model is same as the memory model chosen for modelling the PA circuit 204. In some embodiments, multiplying the input signal matrix Z by the DPD coefficients $\underline{d}_f$ facilitates to apply inverse distortion to the input signal z 214, thereby generating the PA input signal x 208. In some embodiments, the predistortion circuit 202 can comprise one or more circuits or components configured to generate the predistorted signal x 208 from the input signal z 214 (for example, to implement the equation (12a)), based on the distortion coefficients $\underline{d}_f$ 212. Equation 12(a) is one possible way of modifying the input signal z 214 in order to generate the predistorted input signal x 208. Alternately, in other embodiments, the predistortion circuit 202 can be configured to modify the input signal z 214 differently, based on the distortion coefficients $\underline{d}_f$ 212.

Figure 3:
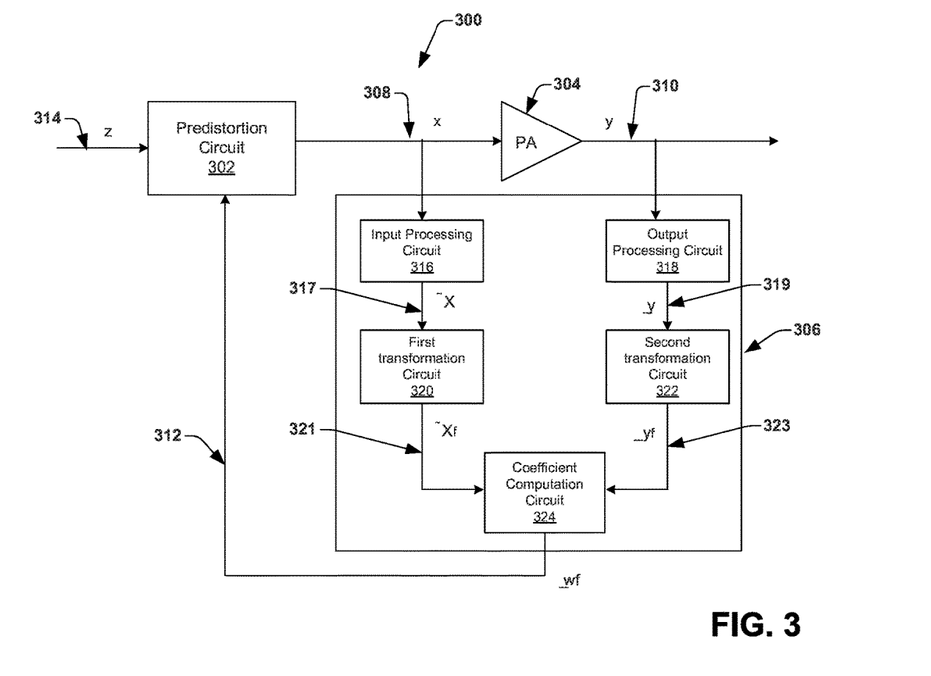
FIG. 3 illustrates an example implementation of an exemplary power amplifier (PA) system that facilitates a frequency selective digital predistortion, according to another embodiment of the disclosure.

FIG. 3 illustrates an example implementation of an exemplary power amplifier (PA) system 300 that facilitates a frequency selective digital predistortion, according to one embodiment of the disclosure. The PA system 300 depicts another possible way of implementation of the PA system 100 in FIG. 1. In particular, the PA system 300 depicts one possible way of estimating frequency selective PA coefficients associated with a PA circuit of the PA system 300, in order to facilitate the frequency selective digital predistortion. Other possible ways of implementation of the PA system 100 are also be contemplated to be within the scope of this disclosure. The PA system 300 comprises a PA circuit 304, a coefficient estimation circuit 306 and a predistortion circuit 302. In some embodiments, the PA circuit 304 is configured to receive a PA input signal 308 and generate a PA output signal 310 based thereon. In some embodiments, the PA circuit 304 is configured to amplify the PA input signal 308 and therefore, in some embodiments, the PA output signal 310 is an amplified version of the PA input signal 308.

The coefficient estimation circuit 306 is coupled to the PA circuit 304 and is configured to receive the PA input signal 308 and the PA output signal 310. In some embodiments, the coefficient estimation circuit 306 is further configured to generate distortion coefficients 312 based on the received PA input signal 308 and the PA output signal 310. In this embodiment, the distortion coefficients 312 comprises PA coefficients associated with the PA circuit 304. In some embodiments, in order to determine the PA coefficients (i.e., the distortion coefficients 312), a memory model (to account for the memory effects) associated with the PA circuit 304 is utilized. In some embodiments, the memory model of the PA circuit 304 is derived, as explained above with respect to FIG. 2. Upon determining the distortion coefficients 312, the coefficient estimation circuit 306 is configured to provide the distortion coefficients 312 to the predistortion circuit 302, in order to predistort the input signal z 314. The key idea behind digital predistortion in power amplifiers that is utilized herein, is to predistort an input signal (e.g., an input signal z 314) to a power amplifier (PA) (e.g., the PA circuit 304), based on an inverse distortion provided to the input signal z 314. In some embodiments, the predistortion circuit 302 can be seen as an inverse of the PA circuit 304. In some embodiments, when the distortion coefficients 312 comprises PA coefficients, the predistortion circuit 302 is further configured to determine the inverse PA coefficients from the received distortion coefficients 312, prior to applying the predistortion to the input signal z 314.

In some embodiments, the coefficient estimation circuit 306 comprises a PA input processing circuit 316 configured to process the PA input signal 308 and generate a PA input $\tilde{X}$ 317, based on the PA input signal 308. In some embodiments, the PA input $\tilde{X}$ 317 comprises a PA input matrix $\tilde{X}$ comprising a plurality of entries. In some embodiments, the entries of the PA input matrix $\tilde{X}$ is determined based on determining a plurality of PA input samples (i.e., PA input measurements), and applying the PA input measurements to a memory model associated with the PA circuit 304. In some embodiments, the PA input 317 corresponds to the PA input matrix $\tilde{X}$ in equation (4) above. In such embodiments, the entries of the PA input matrix $\tilde{X}$ comprises the entries given in equation (3) above. However, in other embodiments, the PA input matrix $\tilde{X}$ can comprise other entries different from that given in equation (3) above, depending on the memory model chosen for modelling the PA circuit 304.

In some embodiments, an information of the memory model chosen and consequently, the PA input matrix $\tilde{X}$, is predetermined and is assumed to be available to the input processing circuit 316 (e.g., stored in a memory associated with the input processing circuit 316). In some embodiments, the PA input processing circuit 316 is configured to generate a plurality of PA input samples from the PA input signal 308, in order to generate the PA input matrix $\tilde{X}$, prior to generating the PA input 317. In some embodiments, the PA input processing circuit 316 can comprise, but not limited to, an analog-to-digital converter (ADC) configured to convert the PA input signal 308 from analog to digital domain. Further, the PA input processing circuit 316 can comprise a mixer (e.g., a down-conversion mixer) and an alignment circuit configured to align digital samples associated with the PA input signal 308, to the input samples associated with the PA output signal 310. In other embodiments, the PA input processing circuit 316 can have additional circuits configured to process the PA input signal 308 and generate the PA input $\tilde{X}$ 317 based thereon.

In some embodiments, the coefficient estimation circuit 306 further comprises a PA output processing circuit 318 configured to process the PA output signal 310 and generate a PA output $\underline{y}$ 319, based on the PA output signal 310. In some embodiments, the PA output $\underline{y}$ 319 comprises a plurality of PA output samples. In some embodiments, the PA output $\underline{y}$ 319 corresponds to the output vector $\underline{y}$ in equation (4) above. In some embodiments, the PA output processing circuit 318 can comprise, but not limited to, an analog-to-digital converter (ADC) configured to convert the PA input signal 308 from analog to digital domain. Further, the PA output processing circuit 318 can comprise a mixer and an alignment circuit configured to align digital samples associated with the PA output signal 310, to input samples associated with the PA input signal 308. In other embodiments, the PA output processing circuit 318 can have additional circuits configured to process the PA output signal 310 and generate the PA output $\underline{y}$ 319 based thereon. In some embodiments, a number of PA output samples to be included in the PA output $\underline{y}$ 319 is predetermined based on the PA system requirements.

In some embodiments, in order to apply different weights to different frequencies associated with the PA output spectrum, the PA input $\tilde{X}$ 317 associated with the PA input signal 308 and the PA output $\underline{y}$ 319 associated with the PA output signal 310 are pre-processed to generate a processed PA input $\hat{X}_f$ 321 and processed PA output $\underline{y}_f$ 323, respectively, prior to generating the distortion coefficients 312, as explained above in FIG. 1. In some embodiments, the coefficient estimation circuit 306 further comprises a first transformation circuit 320 configured to apply a first predetermined weighted function, to the PA input 317, in order to generate the processed PA input $\hat{X}_f$ 321. Further, the coefficient estimation circuit 306 comprise a second transformation circuit 322 configured to apply a second predetermined weighted function, to the PA output 319, in order to generate the processed PA output $\underline{y}_f$ 323. In some embodiments, the first predetermined weighted function and the second predetermined weighted function are indicative of a linear transformation that enables to apply different weights to different frequencies in the PA output spectrum. In some embodiments, the linear transformation to be applied to the PA input 317 and the PA output 319 are determined based on a required frequency response associated with the PA output spectrum.

In some embodiments, the first predetermined weighted function and the second predetermined weighted function are the same. In some embodiments, the first predetermined weighted function and the second predetermined weighted function comprise a linear transformation matrix F, comprising a plurality of filter coefficients associated with a predetermined filter that has the required frequency response. However, in other embodiments, the first weighted function can comprise a linear transformation matrix F1 and the second weighted function can comprise a linear transformation matrix F2, as explained above with respect to FIG. 1. In some embodiments, applying the first predetermined weighted function to the PA input 317 is equivalent to filtering the columns of the PA input matrix $\hat{X}$ associated with the PA input 317 using the predetermined filter (or the filter coefficients associated therewith). Similarly, in some embodiments, applying the second predetermined weighted function to the PA output 319 is equivalent to filtering the PA output using the predetermined filter (or the filter coefficients associated therewith). In some embodiments, applying the linear transformation, for example, the linear transformation matrix F, to the PA input 317 and the PA output 319, prior to determining the distortion coefficients 312, enables to apply different weights to different frequencies in the PA output spectrum.

In this embodiment, the first weighted function and the second weighted function are assumed to be same, comprising a linear transformation matrix F. However, in other embodiments, the first weighted function and the second weighted function can be different. Therefore, in such embodiments, the processed PA input 321 is as given below:

$$\hat{X}_f = F \cdot \hat{X} \tag{13}$$

Where $\hat{X}_f$ is the processed PA input 321, F is the linear transformation matrix and $\hat{X}$ is the PA input matrix associated with the PA input 317.

Similarly, the processed PA output 323 is given as below:

$$\underline{y}_f = F \cdot \underline{y} \tag{14}$$

Where $\underline{y}_f$ is the processed PA output 323, F is the linear transformation matrix and $\underline{y}$ is the PA output 319.

In some embodiments, the linear transformation matrix F comprises a plurality of filter coefficients as given in equation (9) above.

Based on the processed PA input 321 $\hat{X}_f$ and the processed PA output 323 $\underline{y}_f$, the memory model of the PA circuit 304 is given as below:

$$\underline{y}_f = \hat{X}_f \underline{w}_f \tag{15}$$

Where $\underline{w}_f$ correspond to the distortion coefficients 312 (i.e., the PA coefficients) to be determined at the coefficient estimation circuit 306, $\hat{X}_f$ is the processed PA input 321 and $\hat{y}_f$ is the processed PA output 323. In some embodiments, $\underline{w}$ in equation (15) is an improved estimate of the PA coefficient vector $\underline{w}$ in equation (4), based on applying the linear transformation. In some embodiments, the distortion coefficients $\underline{w}_f$ 312 can be determined based on solving equation (15) above. In some embodiments, the equation (15) above is solved based on defining an estimation error e given below as:

$$e = \underline{y}_f - \hat{X}_f \underline{w}_f \tag{16}$$

And a least squares solution for the coefficients $\underline{w}_f$ that minimizes $\|e^2\|$ is given by:

$$\underline{w}_f = (X_f^H \cdot X_f)^{-1} \cdot X_f^H \cdot \underline{y}_f \tag{17}$$

In some embodiments, the coefficient estimation circuit 306 further comprises a coefficient computation circuit 324 coupled to the first transformation circuit 320 and the second transformation circuit 322, and configured to receive the processed PA input 321 from the first transformation circuit 320 and the processed PA output 323 from the second transformation circuit 322. In some embodiments, the coefficient computation circuit 324 is further configured to determine the distortion coefficients $\underline{w}_f$ 312, based on the received processed PA input 321 and the processed PA output 323. In some embodiments, the distortion coefficients $\underline{w}_f$ 312 are determined at the coefficient computation circuit 324 based on implementing the predetermined relation in the equation (17) above. However, other equations for determining the distortion coefficients $\underline{w}_f$ 312 are also contemplated to be within the scope of this disclosure. Upon determining the distortion coefficients $\underline{w}_f$ 312, the coefficient computation circuit 324 is further configured to provide the distortion coefficients $\underline{w}_f$ 312 to the predistortion circuit 302. In this embodiment, since the distortion coefficients $\underline{w}_f$ 312 comprises PA coefficients, the predistortion circuit 302 is configured to generate DPD coefficients $\underline{d}_f$ comprising inverse PA coefficients from the distortion coefficients $\underline{w}_f$ 312, prior to applying inverse distortion to the input signal z 314.

Therefore, in some embodiments, the predistortion circuit 302 is configured to determine DPD coefficients $\underline{d}_f$ from the distortion coefficients $\underline{w}_f$ 312, and modify the input signal z 214 based on the DPD coefficients $\underline{d}_f$, in order to generate the predistorted input signal x 308. In order to determine the DPD coefficients $\underline{d}_f$ from the distortion coefficients $\underline{w}_f$ 312, in some embodiments, the predistortion circuit 302 is configured to determine a PA output estimate $y_{est}$ based on the input signal z 314 and the distortion coefficients $\underline{w}_f$ 312, as given below:

$$y_{est} = Z \cdot \underline{w}_f \tag{18}$$

where Z is an input signal matrix associated with the input signal z 314. In some embodiments, the input signal matrix Z is generated at the predistortion circuit 302 from the input signal z 314, based on a predetermined memory model (e.g., as given in equation (3) above). In some embodiments, the predetermined memory model is same as the memory model chosen for modelling the PA circuit 304. In some embodiments, the equation (18) indicates a memory model associated with a PA having an input Z and output $y_{est}$.

Upon determining the PA output estimate $y_{est}$, inverse PA coefficients can be determined based on an inverse model of the PA having the output $y_{est}$ and the input signal z 314. In some embodiments, the inverse memory model is given as below:

$$z = Y_{est} \cdot \underline{d}_f \tag{19}$$

Where $\underline{d}_f$ is the inverse PA coefficients, also referred to as DPD coefficients, in some embodiments, $Y_{est}$ is an output signal matrix associated with the PA output estimate $y_{est}$ determined using the equation (18) above, and z is the input signal z 314. In some embodiments, the predistortion circuit 302 is configured to determine the inverse PA coefficients or the DPD coefficients based on implementing the following equation:

$$\underline{d}_f = (Y_{est}^H \cdot Y_{est})^{-1} \cdot Y_{est}^H \cdot z \tag{20}$$

In some embodiments, equation (20) is obtained based on solving equation (19) above (for example, as given in equations (11) and (12) above).

Upon determining the DPD coefficients or the inverse PA coefficients $\underline{d}_f$, the predistortion circuit 302 is configured to modify the input signal z 314, in order to generate the predistorted input signal x 308 (i.e., the PA input signal x 308) based on the following equation:

$$x = Z \cdot \underline{d}_f \tag{21}$$

where Z is the input signal matrix associated with the input signal z 314, as explained with respect to equation (18) above.

In some embodiments, the predistortion circuit 302 can comprise one or more circuits or components configured to generate the predistorted signal x 308 from the input signal z 314 (for example, to implement the equations (18), (20) and (21)). Implementing equations (18), (20) and (21))

indicates one possible way of modifying the input signal z 314 in order to generate the predistorted input signal x 308. Alternately, in other embodiments, the predistortion circuit 302 can be configured to modify the input signal z 314 differently, upon receiving the distortion coefficients $\underline{w}_f$ 312.

Figure 4:
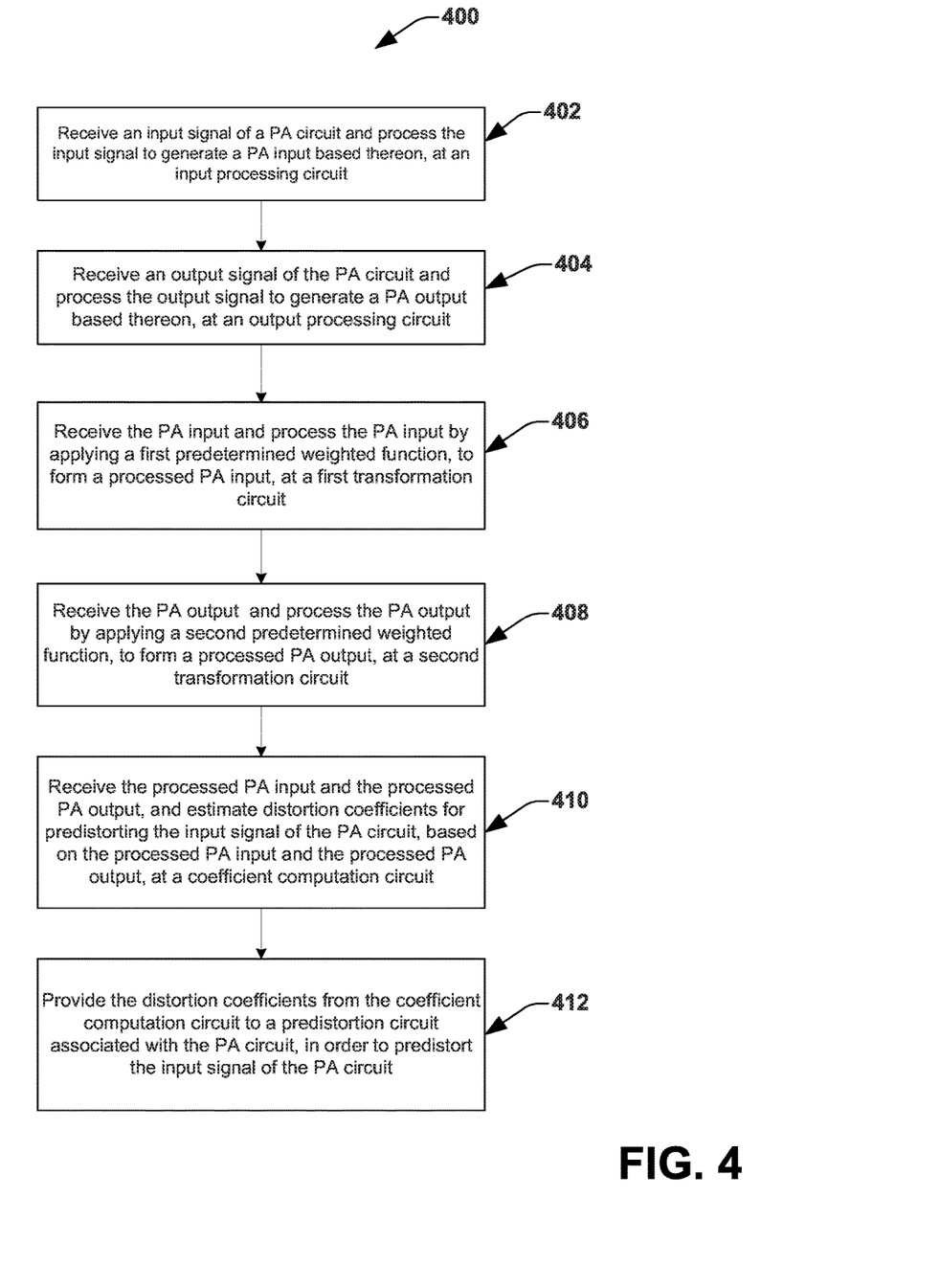
FIG. 4 illustrates of a flow diagram of a method for applying frequency selective digital predistortion (DPD) to a power amplifier (PA) circuit in a PA system, according to one embodiment of the disclosure.

FIG. 4 illustrates of a flow diagram of a method 400 for applying frequency selective digital predistortion (DPD) to a power amplifier (PA) circuit in a PA system, according to one embodiment of the disclosure. The method is explained herein with respect to the PA system 100 in FIG. 1. However, in other embodiments, the method 400 can be applied to any PA system, for example, the PA system 200 in FIG. 2, the PA system 300 in FIG. 3 etc. In some embodiments, the method 400 described herein facilitates to apply specific weights to specified frequencies in the PA output spectrum. At 402, an input signal (e.g., the PA input signal 108 in FIG. 1) of a PA circuit (e.g., the PA circuit 104 in FIG. 1) is received and processed at an input processing circuit (e.g., the input processing circuit 116 in FIG. 1), in order to generate a PA input (e.g., the PA input 117 in FIG. 1) based thereon. At 404, an output signal (e.g., the PA output signal 110 in FIG. 1) of the PA circuit is received and processed at an output processing circuit (e.g., the output processing circuit 118 in FIG. 1), in order to generate a PA output (e.g., the PA output 119 in FIG. 1) based thereon.

In some embodiments, the PA input comprises a PA input vector comprising a plurality of PA input samples associated with the input signal of the PA circuit, and the PA output comprises a PA output matrix constructed from output measurements of the PA circuit, wherein the PA input and the PA output are generated in accordance with a predetermined inverse memory model of the PA circuit (as explained with respect to the PA system 200 in FIG. 2 above). Alternately, in other embodiments, the PA input comprises a PA input matrix constructed from input measurements associated with the input signal of the PA circuit, and the PA output comprises an PA output vector comprising a plurality of PA output samples, wherein the PA input matrix and the PA output vector are generated based on a predetermined memory model associated with the PA circuit (as explained with respect to the PA system 300 in FIG. 3 above).

At 406, the PA input is received and processed at a first transformation circuit (e.g., the first transformation circuit 120 in FIG. 1) by applying a first predetermined weighted function (e.g., the linear transformation matrix F), to form a processed PA input (e.g., the processed PA input 121 in FIG. 1). At 408, the PA output is received and processed at a second transformation circuit (e.g., the second transformation circuit 122 in FIG. 1), by applying a second predetermined weighted function, to form a processed PA output (e.g., the processed PA output 123 in FIG. 1). In some embodiments, the first predetermined weighted function and the second predetermined weighted function are the same. In some embodiments, the first predetermined weighted function and the second predetermined weighted function comprises a linear transformation matrix comprising a plurality of filter coefficients that defines a filter, wherein the filter is determined based on frequencies required in the PA output spectrum.

At 410, the processed PA input and the processed PA output are received at a coefficient computation circuit (e.g., the coefficient computation circuit 124 in FIG. 1) and distortion coefficients (e.g., the distortion coefficients 112 in FIG. 1) for predistorting the input signal of the PA circuit is determined, based on the processed PA input and the processed PA output, at the coefficient computation circuit. In some embodiments, the distortion coefficients comprise inverse PA coefficients associated with the PA circuit (as explained with respect to the PA system 200 in FIG. 2 above) and are determined at the coefficient computation circuit, based on implementing equation (12) above. Alternately, in other embodiments, the distortion coefficients comprise PA coefficients associated with the PA circuit (as explained with respect to the PA system 300 in FIG. 3 above) and are determined at the coefficient computation circuit, based on implementing equation (17) above. At 412, the distortion coefficients from the coefficient computation circuit are provided to a predistortion circuit (e.g., the predistortion circuit 102 in FIG. 1) associated with the PA circuit, in order to predistort the input signal of the PA circuit.

While the methods are illustrated, and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an apparatus that facilitates to apply frequency selective digital predistortion (DPD) to a power amplifier (PA) circuit, comprising a first transformation circuit configured to receive a PA input comprising a quantity indicative of an input signal of the PA circuit and process the PA input by applying a first predetermined weighted function, to form a processed PA input; a second transformation circuit configured to receive a PA output comprising a quantity indicative of an output signal of the PA circuit and process the PA output by applying a second predetermined weighted function, to form a processed PA output, wherein the first predetermined weighted function and the second predetermined weighted function facilitates to apply specific weights to specified frequencies in an output spectrum of the PA circuit; and a coefficient computation circuit configured to receive the processed PA input and the processed PA output; and estimate distortion coefficients, to be utilized for predistorting the input signal of the PA circuit, based on the processed PA input and the processed PA output.

Example 2 is an apparatus, including the subject matter of example 1, wherein the first predetermined weighted function and the second predetermined weighted function facilitates to apply specific weights to specified frequencies in an output spectrum of the PA circuit Example 3 is an apparatus, including the subject matter of examples 1-2, including or omitting elements, wherein the distortion coefficients comprises inverse PA coefficients associated with the PA circuit, estimated based on a predetermined relation between the processed PA output and the processed PA input, wherein the predetermined relation is derived in accordance with a predetermined inverse memory model of the PA circuit.

Example 4 is an apparatus, including the subject matter of examples 1-3, including or omitting elements, wherein the PA input comprises a PA input vector comprising a plurality of PA input samples associated with the input signal of the PA circuit and the PA output comprises a PA output matrix constructed from output measurements of the PA circuit, wherein the PA output matrix is constructed based on the predetermined inverse memory model associated with the PA circuit.

Example 5 is an apparatus, including the subject matter of examples 1-4, including or omitting elements, wherein the distortion coefficients comprises PA coefficients associated with the PA circuit, estimated based on a predetermined relation between the processed PA output and the processed PA input, wherein the predetermined relation is derived in accordance with a predetermined memory model of the PA circuit.

Example 6 is an apparatus, including the subject matter of examples 1-5, including or omitting elements, wherein the PA input comprises a PA input matrix constructed from input measurements associated with the input signal of the PA circuit, wherein the PA input matrix is constructed based on the predetermined memory model associated with the PA circuit, and the PA output comprises an PA output vector comprising a plurality of PA output samples.

Example 7 is an apparatus, including the subject matter of examples 1-6, including or omitting elements, wherein the coefficient computation circuit is further configured to provide the predistortion coefficients to a predistortion circuit associated with the PA circuit, in order to predistort the input signal of the PA circuit.

Example 8 is an apparatus, including the subject matter of examples 1-7, including or omitting elements, wherein the first predetermined weighted function and the second predetermined weighted function are the same.

Example 9 is an apparatus, including the subject matter of examples 1-8, including or omitting elements, further comprising an input processing circuit configured to receive the input signal of the PA and generate the PA input based thereon.

Example 10 is an apparatus, including the subject matter of examples 1-9, including or omitting elements, further comprising an output processing circuit configured to receive the output signal of the PA and generate the PA output based thereon.

Example 11 is an apparatus, including the subject matter of examples 1-10, including or omitting elements, wherein the first predetermined weighted function and the second predetermined weighted function comprises a linear transformation matrix comprising a plurality of filter coefficients that defines a filter, wherein the filter is determined based on frequencies required in the output spectrum of the PA circuit.

Example 12 is a power amplifier (PA) system, comprising a PA circuit configured to receive a PA input signal and amplify the PA input signal to generate a PA output signal based thereon; a coefficient estimation circuit, comprising a first transformation circuit configured to receive a PA input comprising a quantity indicative of the PA input signal associated with the PA circuit and process the PA input by applying a first predetermined weighted function, to form a processed PA input; a second transformation circuit configured to receive a PA output comprising a quantity indicative of the PA output signal associated with the PA circuit and process the PA output by applying a second predetermined weighted function, to form a processed PA output, wherein the first predetermined weighted function and the first predetermined weighted function facilitates to apply specific weights to specified frequencies in an output spectrum of the PA circuit; and a coefficient computation circuit configured to receive the processed PA input and the processed PA output; and estimate distortion coefficients to be utilized for predistorting the PA input signal, based on the processed PA input and the processed PA output.

Example 13 is a system, including the subject matter of example 12, wherein the first predetermined weighted function and the first predetermined weighted function facilitates to apply specific weights to specified frequencies in an output spectrum of the PA circuit.

Example 14 is a system, including the subject matter of examples 12-13, including or omitting elements, further comprising a predistortion circuit coupled to the input of the PA circuit and configured to receive the distortion coefficients from the coefficient estimation circuit; and modify the PA input signal, based on the distortion coefficients.

Example 15 is a system, including the subject matter of examples 12-14, including or omitting elements, wherein the distortion coefficients comprises inverse PA coefficients associated with the PA circuit, estimated based on a predetermined relation between the processed PA output and the processed PA input, wherein the predetermined relation is derived in accordance with a predetermined inverse memory model of the PA circuit.

Example 16 is a system, including the subject matter of examples 12-15, including or omitting elements, wherein the PA input comprises a PA input vector comprising a plurality of PA input samples associated with the PA input signal and the PA output comprises a PA output matrix constructed from output measurements of the PA output signal associated with the PA circuit, wherein the PA output matrix is constructed based on the predetermined inverse memory model associated with the PA circuit.

Example 17 is a system, including the subject matter of examples 12-16, including or omitting elements, wherein the distortion coefficients comprises PA coefficients associated with the PA circuit, estimated based on a predetermined relation between the processed PA output and the processed PA input, wherein the predetermined relation is derived in accordance with a predetermined memory model of the PA circuit.

Example 18 is a system, including the subject matter of examples 12-17, including or omitting elements, wherein the PA input comprises a PA input matrix constructed from input measurements associated with the PA input signal, wherein the PA input matrix is constructed based on the predetermined memory model associated with the PA circuit, and the PA output comprises an PA output vector comprising a plurality of PA output samples associated with the PA output signal.

Example 19 is a system, including the subject matter of examples 12-18, including or omitting elements, wherein the first predetermined weighted function and the second predetermined weighted function are the same.

Example 20 is a system, including the subject matter of examples 12-19, including or omitting elements, wherein the coefficient estimation circuit further comprises an output processing circuit configured to receive the PA output signal and generate the PA output based thereon.

Example 21 is a system, including the subject matter of examples 12-20, including or omitting elements, wherein the coefficient estimation circuit further comprising an input processing circuit configured to receive the PA input signal and generate the PA input based thereon.

Example 22 is a system, including the subject matter of examples 12-21, including or omitting elements, wherein the first predetermined weighted function and the second predetermined weighted function comprises a linear transformation matrix comprising a plurality of filter coefficients that defines a filter, wherein the filter is determined based on frequencies required in the output spectrum of the PA circuit.

Example 23 is a method for applying digital predistortion (DPD) to a power amplifier (PA) circuit, comprising receiving a PA input comprising a quantity indicative of an input signal of the PA circuit and processing the PA input by applying a first predetermined weighted function, to form a processed PA input, at a first transformation circuit; receiving a PA output comprising a quantity indicative of an output signal of the PA circuit and processing the PA output by applying a second predetermined weighted function, to form a processed PA output, at a second transformation circuit, wherein the first predetermined weighted function and the first predetermined weighted function facilitates to apply specific weights to specified frequencies in an output spectrum of the PA circuit; and receiving the processed PA input and the processed PA output, and estimating distortion coefficients to be utilized for predistorting the input signal of the PA circuit, based on the processed PA input and the processed PA output, at a coefficient computation circuit.

Example 24 is a method, including the subject matter of example 23, wherein the first predetermined weighted function and the first predetermined weighted function facilitates to apply specific weights to specified frequencies in an output spectrum of the PA circuit.

Example 25 is a method, including the subject matter of examples 23-24, including or omitting elements, further comprising providing the distortion coefficients from the coefficient computation circuit to a predistortion circuit associated with the PA circuit, in order to predistort the input signal of the PA circuit.

Example 26 is a method, including the subject matter of examples 23-25, including or omitting elements, wherein the distortion coefficients comprises inverse PA coefficients associated with the PA circuit, estimated based on a predetermined relation between the processed PA output and the processed PA input, wherein the predetermined relation is derived in accordance with a predetermined inverse memory model of the PA circuit.

Example 27 is a method, including the subject matter of examples 23-26, including or omitting elements, wherein the PA input comprises a PA input vector comprising a plurality of PA input samples associated with the input signal of the PA circuit and the PA output comprises a PA output matrix constructed from output measurements of the PA circuit, corresponding to the plurality of PA input samples, wherein the PA output matrix is constructed based on the predetermined inverse memory model associated with the PA circuit.

Example 28 is a method, including the subject matter of examples 23-27, including or omitting elements, wherein the distortion coefficients comprises PA coefficients associated with the PA circuit, estimated based on a predetermined relation between the processed PA output and the processed PA input, wherein the predetermined relation is derived in accordance with a predetermined memory model of the PA circuit.

Example 29 is a method, including the subject matter of examples 23-28, including or omitting elements, wherein the PA input comprises a PA input matrix constructed from input measurements associated with the input signal of the PA circuit, wherein the PA input matrix is constructed based on the predetermined memory model associated with the PA circuit, and the PA output comprises an PA output vector comprising a plurality of PA output samples.

Example 30 is a method, including the subject matter of examples 23-29, including or omitting elements, wherein the first predetermined weighted function and the second predetermined weighted function are the same.

Example 31 is a method, including the subject matter of examples 23-30, including or omitting elements, further comprising receiving the output signal of the PA circuit and generating the PA output based thereon, at an output processing circuit, prior to receiving the PA output at the second transformation circuit.

Example 32 is a method, including the subject matter of examples 23-31, including or omitting elements, further comprising receiving the input signal of the PA circuit and generating the PA input based thereon, at an input processing circuit, prior to receiving the PA input at the first transformation circuit.

Example 33 is a method, including the subject matter of examples 23-32, including or omitting elements, wherein the first predetermined weighted function and the second predetermined weighted function comprises a linear transformation matrix comprising a plurality of filter coefficients that defines a filter, wherein the filter is determined based on frequencies required in the output spectrum of the PA circuit.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed.

While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. An apparatus that facilitates to apply frequency selective digital predistortion (DPD) to a power amplifier (PA) circuit, comprises:
   a first transformation circuit configured to receive a PA input comprising a processed version of an input signal of the PA circuit and process the PA input based on a first predetermined weighted function, to form a processed PA input;
   a second transformation circuit configured to receive a PA output comprising a processed version of an output signal of the PA circuit and process the PA output based on a second predetermined weighted function, to form a processed PA output; and
   a coefficient computation circuit configured to:
      receive the processed PA input and the processed PA output; and
      estimate distortion coefficients, to be utilized for predistorting the input signal of the PA circuit, based on the processed PA input and the processed PA output.

2. The apparatus of claim 1, wherein the first predetermined weighted function and the second predetermined weighted function facilitates to apply specific weights to specified frequencies in an output spectrum of the PA circuit.

3. The apparatus of claim 1, wherein the distortion coefficients comprises inverse PA coefficients associated with the PA circuit, estimated based on a predetermined relation between the processed PA output and the processed PA input, wherein the predetermined relation is derived in accordance with a predetermined inverse memory model of the PA circuit.

4. The apparatus of claim 3, wherein the PA input comprises a PA input vector comprising a plurality of PA input samples associated with the input signal of the PA circuit and the PA output comprises a PA output matrix constructed from output measurements of the PA circuit, wherein the PA output matrix is constructed based on the predetermined inverse memory model associated with the PA circuit.

5. The apparatus of claim 1, wherein the distortion coefficients comprises PA coefficients associated with the PA circuit, estimated based on a predetermined relation between the processed PA output and the processed PA input, wherein the predetermined relation is derived in accordance with a predetermined memory model of the PA circuit.

6. The apparatus of claim 5, wherein the PA input comprises a PA input matrix constructed from input measurements associated with the input signal of the PA circuit, wherein the PA input matrix is constructed based on the predetermined memory model associated with the PA circuit, and the PA output comprises an PA output vector comprising a plurality of PA output samples.

7. The apparatus of claim 1, wherein the coefficient computation circuit is further configured to provide the predistortion coefficients to a predistortion circuit associated with the PA circuit, in order to predistort the input signal of the PA circuit.

8. The apparatus of claim 1, wherein the first predetermined weighted function and the second predetermined weighted function are the same.

9. The apparatus of claim 1, further comprising an input processing circuit configured to receive the input signal of the PA and generate the PA input based thereon.

10. The apparatus of claim 1, further comprising an output processing circuit configured to receive the output signal of the PA and generate the PA output based thereon.

11. The apparatus of claim 2, wherein the first predetermined weighted function and the second predetermined weighted function comprises a linear transformation matrix comprising a plurality of filter coefficients that defines a filter, wherein the filter is determined based on frequencies required in the output spectrum of the PA circuit.

12. A power amplifier (PA) system, comprises:
   a PA circuit configured to receive a PA input signal and amplify the PA input signal to generate a PA output signal based thereon;
   a coefficient estimation circuit, comprising:
      a first transformation circuit configured to receive a PA input comprising a processed version of the PA input signal associated with the PA circuit and process the PA input based on a first predetermined weighted function, to form a processed PA input;
      a second transformation circuit configured to receive a PA output comprising a processed version of the PA output signal associated with the PA circuit and process the PA output based on a second predetermined weighted function, to form a processed PA output; and
      a coefficient computation circuit configured to:
         receive the processed PA input and the processed PA output; and
         estimate distortion coefficients to be utilized for predistorting the PA input signal, based on the processed PA input and the processed PA output.

13. The system of claim 12, wherein the first predetermined weighted function and the first predetermined weighted function facilitates to apply specific weights to specified frequencies in an output spectrum of the PA circuit.

14. The system of claim 12, further comprising a predistortion circuit coupled to the input of the PA circuit and configured to:
   receive the distortion coefficients from the coefficient estimation circuit; and modify the PA input signal, based on the distortion coefficients.

15. The system of claim 12, wherein the distortion coefficients comprises inverse PA coefficients associated with the PA circuit, estimated based on a predetermined relation between the processed PA output and the processed PA input, wherein the predetermined relation is derived in accordance with a predetermined inverse memory model of the PA circuit.

16. The system of claim 15, wherein the PA input comprises a PA input vector comprising a plurality of PA input samples associated with the PA input signal and the PA output comprises a PA output matrix constructed from output measurements of the PA output signal associated with the PA circuit, wherein the PA output matrix is constructed based on the predetermined inverse memory model associated with the PA circuit.

17. The system of claim 12, wherein the distortion coefficients comprises PA coefficients associated with the PA circuit, estimated based on a predetermined relation between the processed PA output and the processed PA input, wherein the predetermined relation is derived in accordance with a predetermined memory model of the PA circuit.

18. The system of claim 17, wherein the PA input comprises a PA input matrix constructed from input measurements associated with the PA input signal, wherein the PA input matrix is constructed based on the predetermined memory model associated with the PA circuit, and the PA output comprises an PA output vector comprising a plurality of PA output samples associated with the PA output signal.

19. The system of claim 12, wherein the first predetermined weighted function and the second predetermined weighted function are the same.

20. The system of claim 12, wherein the coefficient estimation circuit further comprises an output processing circuit configured to receive the PA output signal and generate the PA output based thereon.

21. The system of claim 12, wherein the coefficient estimation circuit further comprising an input processing circuit configured to receive the PA input signal and generate the PA input based thereon.

22. The system of claim 13, wherein the first predetermined weighted function and the second predetermined weighted function comprises a linear transformation matrix comprising a plurality of filter coefficients that defines a filter, wherein the filter is determined based on frequencies required in the output spectrum of the PA circuit.

23. A method for applying digital predistortion (DPD) to a power amplifier (PA) circuit, comprising:

receiving a PA input comprising a processed version of an input signal of the PA circuit and processing the PA input based on a first predetermined weighted function, to form a processed PA input, at a first transformation circuit;

receiving a PA output comprising a processed version of an output signal of the PA circuit and processing the PA output based on a second predetermined weighted function, to form a processed PA output, at a second transformation circuit; and receiving the processed PA input and the processed PA output, and estimating distortion coefficients to be utilized for predistorting the input signal of the PA circuit, based on the processed PA input and the processed PA output, at a coefficient computation circuit.

24. The method of claim 23, wherein the first predetermined weighted function and the first predetermined weighted function facilitates to apply specific weights to specified frequencies in an output spectrum of the PA circuit.

25. The method of claim 23, wherein the distortion coefficients comprises inverse PA coefficients associated with the PA circuit, estimated based on a predetermined relation between the processed PA output and the processed PA input, wherein the predetermined relation is derived in accordance with a predetermined inverse memory model of the PA circuit.

26. The method of claim 24, wherein the PA input comprises a PA input vector comprising a plurality of PA input samples associated with the input signal of the PA circuit and the PA output comprises a PA output matrix constructed from output measurements of the PA circuit, corresponding to the plurality of PA input samples, wherein the PA output matrix is constructed based on the predetermined inverse memory model associated with the PA circuit.

27. The method of claim 23, wherein the distortion coefficients comprises PA coefficients associated with the PA circuit, estimated based on a predetermined relation between the processed PA output and the processed PA input, wherein the predetermined relation is derived in accordance with a predetermined memory model of the PA circuit.

28. The method of claim 26, wherein the PA input comprises a PA input matrix constructed from input measurements associated with the input signal of the PA circuit, wherein the PA input matrix is constructed based on the predetermined memory model associated with the PA circuit, and the PA output comprises an PA output vector comprising a plurality of PA output samples.

* * * * *